(12) United States Patent
May

(10) Patent No.: US 6,432,812 B1
(45) Date of Patent: Aug. 13, 2002

(54) METHOD OF COUPLING CAPACITANCE REDUCTION

(75) Inventor: Charles E. May, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/906,331

(22) Filed: Jul. 16, 2001

(51) Int. Cl.7 .......................................... H01L 21/4763
(52) U.S. Cl. ..................... 438/619; 438/666; 438/669; 438/673; 438/720
(58) Field of Search ............................ 438/619, 666, 438/669, 673, 720

(56) References Cited

U.S. PATENT DOCUMENTS

| | | | | |
|---|---|---|---|---|
| 4,798,650 A | * | 1/1989 | Nakamura et al. .......... 156/643 |
| 5,407,860 A | * | 4/1995 | Stoltz et al. ................. 437/180 |
| 5,416,048 A | * | 5/1995 | Blalock et al. .............. 437/228 |
| 5,641,712 A | * | 6/1997 | Grivna et al. ............... 438/619 |
| 5,814,555 A | * | 9/1998 | Bandyopadhyay et al. . 438/619 |
| 6,025,260 A | * | 2/2000 | Lien et al. ................... 438/619 |
| 6,033,986 A | * | 3/2000 | Itoh ............................. 438/673 |
| 6,077,789 A | * | 6/2000 | Huang ........................ 438/720 |
| 6,093,637 A | * | 7/2000 | Kishimoto et al. ......... 438/669 |
| 6,130,151 A | * | 10/2000 | Lin et al. .................... 438/619 |
| 6,136,687 A | * | 10/2000 | Lee et al. .................... 438/669 |
| 6,146,985 A | * | 11/2000 | Wollesen .................... 438/619 |
| 6,160,316 A | * | 12/2000 | Gardner et al. ............. 257/773 |
| 6,208,015 B1 | | 3/2001 | Bandyopadhyay et al. . 257/635 |
| 6,228,763 B1 | * | 5/2001 | Lee ............................. 438/619 |
| 6,242,336 B1 | * | 6/2001 | Ueda et al. .................. 438/619 |
| 6,274,475 B1 | * | 8/2001 | Shields ........................ 438/666 |
| 6,303,464 B1 | * | 10/2001 | Gaw et al. ................... 438/619 |
| 6,309,946 B1 | * | 10/2001 | Givens ........................ 438/619 |
| 2001/0023128 A1 | * | 9/2001 | Ueda et al. .................. 438/619 |
| 2001/0051423 A1 | * | 12/2001 | Kim et al. ................... 438/619 |

* cited by examiner

Primary Examiner—John F. Niebling
Assistant Examiner—Lynne A. Gurley
(74) Attorney, Agent, or Firm—Luedeka, Neely & Graham

(57) ABSTRACT

A method for reducing the coupling capacitance between adjacent electrically conductive interconnect lines of an integrated circuit. An electrically conductive layer is deposited and etched to produce electrically conductive interconnect lines having negatively sloped sidewalls. An insulating layer is deposited on the electrically conductive interconnect lines using a directional deposition to create a void between and directly adjacent electrically conductive interconnect lines. The void has a substantially lower dielectric constant than the material of the insulating layer, which reduces the coupling capacitance between adjacent electrically conductive interconnect lines.

10 Claims, 1 Drawing Sheet

METHOD OF COUPLING CAPACITANCE REDUCTION

FIELD

This invention relates generally to the field of integrated circuit fabrication, and in particular the invention relates to reducing the coupling capacitance between closely spaced electrically conductive interconnect lines, or in other words reducing the effective dielectric constant of the material between closely spaced electrically conductive interconnect lines.

BACKGROUND

During fabrication of an integrated circuit, a variety of layers of electrically insulating materials and electrically conducting materials are typically deposited on a substrate. The layers are patterned by selectively removing portions of the layers, to form the desired electrical circuits. The need for faster and more complex integrated circuits provides incentive to decrease the size of the integrated circuits. As the size of the integrated circuit decreases, the size of the electrically conductive interconnects between the various components of the integrated circuit also tends to decrease. For proper performance of the integrated circuit, it is desirable to maintain high reliability and low electrical resistance while decreasing both the size of the electrical interconnects and the spacing between adjacent electrical interconnects.

Highly conductive materials, such as metals, are often used for forming the electrically conductive interconnect lines of integrated circuits. As the size of and spacing between the electrically conductive interconnect lines decreases, the capacitance between closely spaced interconnects tends to increase, causing a generally commensurate increase in cross talk and power dissipation between adjacent interconnect lines. Cross talk is the signal interference between electrically conductive interconnect lines, which tends to adversely affect signal integrity and signal strength. Power dissipation is the dynamic power drained by unwanted capacitance charging and discharging in a circuit.

What is needed, therefore, is a method for reducing coupling capacitance between adjacent electrically conductive interconnect lines in an integrated circuit.

SUMMARY

These and other needs are provided by a method for reducing the coupling capacitance between electrically conductive interconnect lines of an integrated circuit. A conductive layer is deposited on a substrate, and etched to define electrically conductive interconnect lines having negatively sloped sidewalls. The negatively sloping sidewalls of adjacent electrically conductive interconnect lines form undercut gaps in the conductive layer. An insulating layer is deposited on the etched conductive layer using a directional physical vapor deposition to cover the undercut gaps and form a void in each of the undercut gaps. The void is directly adjacent the negative sloping sidewalls of adjacent electrically conductive interconnect lines.

In another aspect the invention provides an integrated circuit having closely spaced electrically conductive interconnect lines. A void is formed between and directly adjacent undercut sidewalls of adjacent electrically conductive interconnect lines. The void preferably has a dielectric constant that is less than about two.

An advantage of the invention is. that it provides an integrated circuit having air gaps between electrically conductive interconnect lines so that more closely spaced interconnect lines can be provided on a substrate surface. Furthermore, the dielectric constant of the void between adjacent interconnect lines tends to be substantially lower than those of the insulating materials that are typically used, such as silicon oxide. Because of the negatively sloping sidewalls of the adjacent interconnect lines, the void space in the gap is preferably relatively high, resulting in a relatively small effective dielectric constant, which in turn results in a substantially lower effective capacitance between adjacent electrically conductive interconnect lines.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
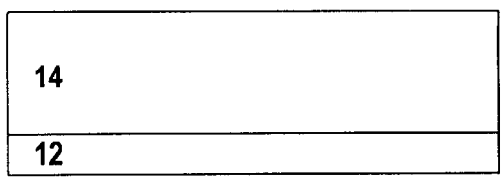
FIG. 1 is a cross sectional view of an electrically conductive layer on a substrate.

Referring now to FIG. 1, a method is provided for reducing the coupling capacitance between the closely spaced electrically conductive interconnect lines of an integrated circuit 10. The integrated circuit 10 preferably includes one or more active or passive elements that are electrically connected by electrically conductive interconnect lines An electrically conductive material such as gold, aluminum, copper, tin, tantalum, titanium, platinum, tungsten, molybdenum, polysilicon, or a mixture or alloy of two or more of the foregoing is deposited on a substrate 12 to provide an electrically conductive layer 14. The electrically conductive layer 14 is preferably substantially evenly deposited over the whole surface of the substrate 12. The substrate 12 may further comprise a plurality of various layers. Most preferably, the topmost layer of the substrate 12 on which the electrically conductive layer 14 is deposited is a non electrically conductive, or insulating layer.

Figure 2:
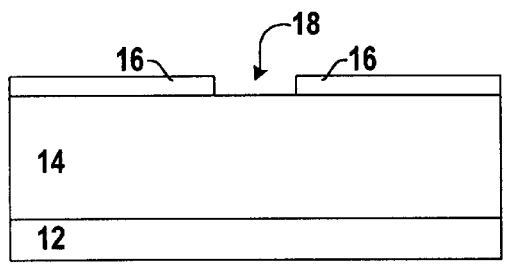
FIG. 2 is a cross sectional view of the electrically conductive layer on a substrate with a patterned layer of photoresist.

Referring now to FIG. 2, a masking layer 16, such as photoresist, is deposited on the conductive layer 14. The masking layer 16 is preferably patterned using conventional photolithography techniques to provide an opening 18 in the masking layer 16, which opening 18 corresponds to the spacing between adjacent interconnect lines that are to be formed in the conductive layer 14.

Figure 3:
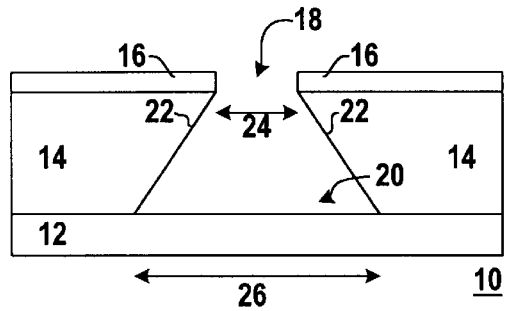
FIG. 3 is a cross sectional view of an etched electrically conductive layer on a substrate.

As illustrated in FIG. 3, gap 20 between adjacent electrically conductive interconnect lines is formed in the conductive layer 14 by a process such as plasma etching the conductive layer 14 through the opening 18 in the masking layer 16. Etching of the conductive layer 14 is preferably conducted in a manner whereby the sidewalls 22 of the gap 20 have a negative slope, or in other words, where the sidewalls 22 of the gap 20 are closer together at the top of the gap 20 than they are at the bottom of the gap 20.

Without being bound to a particular method of formation of the gap 20, or a particular theory of how the negative slope of the sidewalls 22 of the gap 20 are formed, the gap 20 may be plasma etched in the absence of a magnetic field. During an initial etching period, polymer forming gases, such as halogenated methane and the like are used to form polymeric substances on the sidewalls 22 of the conductive layer 14 as they start to be formed, thereby passivating the upper portions of the sidewalls 22 so that boron halide species such as $BCl_3$ anisotropically etch the conductive layer 14. However, unlike conventional etching processes, after about ten to about fifteen seconds into the etching process, the plasma chamber is purposefully depleted of polymer forming gases so that the lower portions of the sidewalls 22 of the conductive layer 14 are not passivated.

Figure 4:
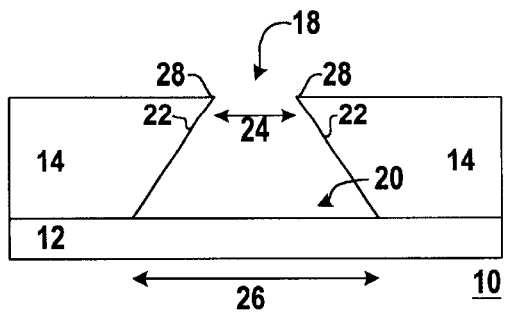
FIG. 4 is a cross sectional view of negatively sloped sidewalls of adjacent electrically conductive interconnect lines.

At this point in the etching process, the conductive layer 14 is etched isotropically, resulting in undercut regions and negatively sloping sidewalls 22 as illustrated in FIG. 3. The process produces a gap 20 in the conductive layer 14, where the width 24 at the top of the gap 20 is substantially smaller than the width 26 at the bottom of the gap 20. The etching process thus produces ledges or overhangs 28 in the conductive layer 14 at the top of the gap 20, as depicted in FIG. 4.

Figure 5:
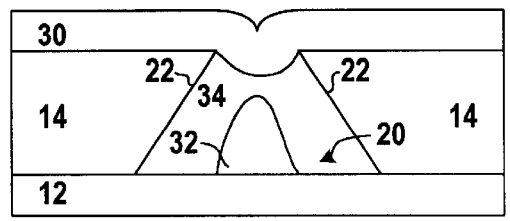
FIG. 5 is a cross sectional view of a layer sealing a void between adjacent electrically conductive interconnect lines.

Regardless of the exact process used to form the overhangs 28 in the conductive layer 14, the overhangs 28 preferably enable the formation of a sealed void 34 in the conductive layer 14, as depicted in FIG. 5. A dielectric layer 30 is preferably deposited on top of the etched conductive layer 14 under conditions sufficient to form the void 34 in the gap 20. The dielectric layer 30 is preferably a layer of substantially non electrically conductive material such as, but not limited to silicon nitride, silicon oxide such as silicon dioxide, boron nitride, and silicon carbide. A particularly preferred dielectric layer 30 is a silicon oxide layer deposited with a modified silane physical vapor deposition process.

The deposition reactor in which the dielectric layer 30 is deposited is preferably detuned and highly directional to provide poor step coverage of the dielectric layer 30 over the gap 20 in the conductive layer 14. Accordingly, a deposit 32 of the dielectric material may be deposited in the gap 20. However, the portions of gap 20 directly adjacent the sidewalls 22 of the conductive layer 14 are filled with the void 34 created in the gap 20. In other words, the dielectric material 32 formed at the bottom of the gap 20 preferably does not substantially contact the sidewalls 22 of the conductive layer 14.

Most of the void 34 is not filled with any solid material. The void 34 preferably extends substantially completely across the gap 20 between the negatively sloping sidewalls 22 of the gap 20, as depicted in FIG. 5. In other words, there is preferably substantially no deposited material on the negatively sloped sidewalls 22, or on a substantial portion of the substrate 12 at the bottom of the gap 20. Thus, according to the method of the present invention, it is preferred that a minimal amount of material be deposited within the gap 20, and that the void 34 comprise a relatively large portion of the gap 20. However, the deposited dielectric material 32 may contact the layer 30 of dielectric material, as depicted in FIG. 6.

The void 34 may be filled with any one of a number of gases, such as the precursor gases used during the deposition process whereby the dielectric layer 30 was formed. Most preferably the void 34 is filled with air. By filling the gap 20 between the interconnect lines formed in the conductive layer 14 with a gas that has a dielectric constant that is preferably less than the dielectric constant of the insulating material used to form the dielectric layer 30, which for the materials most commonly used is no less than about two, the capacitive coupling between adjacent interconnect lines is preferably commensurately reduced. The effective dielectric constant of the void 34 is preferably between about one and about one and a half. The gas within the void 34 may be at a pressure that is alternately greater than, less than, or substantially equal to atmospheric pressure.

Figure 6:
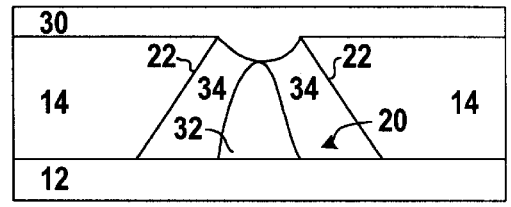
FIG. 6 is a cross sectional view of the planarized layer over the void.

After depositing the dielectric layer 30 on the etched conductive layer 14, the dielectric layer 30 is preferably planarized, such as with a chemical mechanical polish, as depicted in FIG. 6. Additional layers may be selectively deposited on the planarized dielectric layer 30 and the process of etching the layers is repeated to create an integrated circuit having relatively low coupling capacitance between adjacent interconnect lines.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for reducing the coupling capacitance between electrically conductive interconnect lines of an integrated circuit, the method comprising the steps of:

depositing a conductive layer on a substrate, etching the conductive layer to define the electrically conductive interconnect lines, where the electrically conductive interconnect lines have sidewalls with negative slopes, the negatively sloping sidewalls of adjacent electrically conductive interconnect lines forming undercut gaps in the conductive layer, and depositing an insulating layer on the etched conductive layer using a directional deposition to cover the undercut gaps and to form a void in each of the undercut gaps, where the void is directly adjacent the negative sloping sidewalls of adjacent electrically conductive interconnect lines.

2. The method of claim 1 wherein the void is filled with air.

3. The method of claim 1 further comprising planarizing the insulating layer with a chemical mechanical polishing process.

4. The method of claim 1 wherein the insulating layer comprises silicon oxide formed in a silane process.

5. The method of claim 1 wherein the dielectric constant of the void between adjacent electrically conductive interconnect lines is less than about two.

6. The method of claim 1 wherein the etching step comprises etching the conductive layer with a plasma containing a polymerizing gas for no more than about fifteen seconds and then substantially removing the polymerizing gas from the plasma while etching of the conductive layer is completed.

7. A method for reducing the capacitance between adjacent electrically conductive interconnect lines of an integrated circuit, the method comprising the steps of:

depositing a substantially continuous conductive layer on a substrate, etching the conductive layer to define the electrically conductive interconnect lines, where the electrically conductive interconnect lines have sidewalls with negative slopes, the negatively sloping sidewalls of adjacent electrically conductive interconnect lines forming undercut gaps in the conductive layer, depositing an insulating layer on the etched conductive layer using a directional physical vapor deposition to cover the undercut gaps and to form a void in each of the undercut gaps, where the void is directly adjacent the negative sloping sidewalls of adjacent electrically conductive interconnect lines, and planarizing the insulating layer with a chemical mechanical polishing process, where the void between adjacent electrically conductive interconnect lines has an effective dielectric constant that is less than about two.

8. The method of claim 7 wherein the void contains air.

9. The method of claim 7 wherein the insulating layer comprises silicon oxide.

10. The method of claim 7 wherein the etching step comprises etching the conductive layer with a plasma containing a polymerizing gas for no more than about fifteen seconds and then substantially removing the polymerizing gas from the plasma while etching of the conductive layer is completed.

* * * * *